(12) United States Patent
Maone et al.

(10) Patent No.: US 6,674,666 B2
(45) Date of Patent: Jan. 6, 2004

(54) DEVICE AND METHOD FOR TIMING THE READING OF A NONVOLATILE MEMORY WITH REDUCED SWITCHING NOISE

(75) Inventors: Alessandro Francesco Maone, Palermo (IT); Maurizio Francesco Perroni, Furnari (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/077,687

(22) Filed: Feb. 15, 2002

(65) Prior Publication Data

US 2002/0145909 A1 Oct. 10, 2002

(30) Foreign Application Priority Data

Feb. 20, 2001 (IT) ...................... TO2001A0148

(51) Int. Cl.[7] ............................................... G11C 11/34
(52) U.S. Cl. .................... 365/185.21; 365/233
(58) Field of Search .............................. 365/185.21, 233

(56) References Cited

U.S. PATENT DOCUMENTS 5,563,843 A * 10/1996 Fackenthal et al. ...... 365/233.5

* cited by examiner

*Primary Examiner*—M. Tran
(74) *Attorney, Agent, or Firm*—Lisa K. Jorgenson; Robert Iannucci; Seed IP Law Group PLLC

(57) ABSTRACT

The reading timing device has a data-sensing stage, receiving a sensing-latch signal, and an output stage, including an output buffer and enabled at a first switching edge of a synchronization signal. A reading timing stage generates the sensing-latch signal not before a preset time interval from the first switching edge of the synchronization signal. Thereby, reading, in particular data-latching in the data-sensing stage, is temporarily separated from switching of the output buffers. This separation is obtained using the sync signal. Since the output buffers must switch in a preset time from the rising edge of the sync signal, the pulse of the sensing-latch signal is shifted after this time, and more precisely after the falling edge of the sync signal.

18 Claims, 5 Drawing Sheets

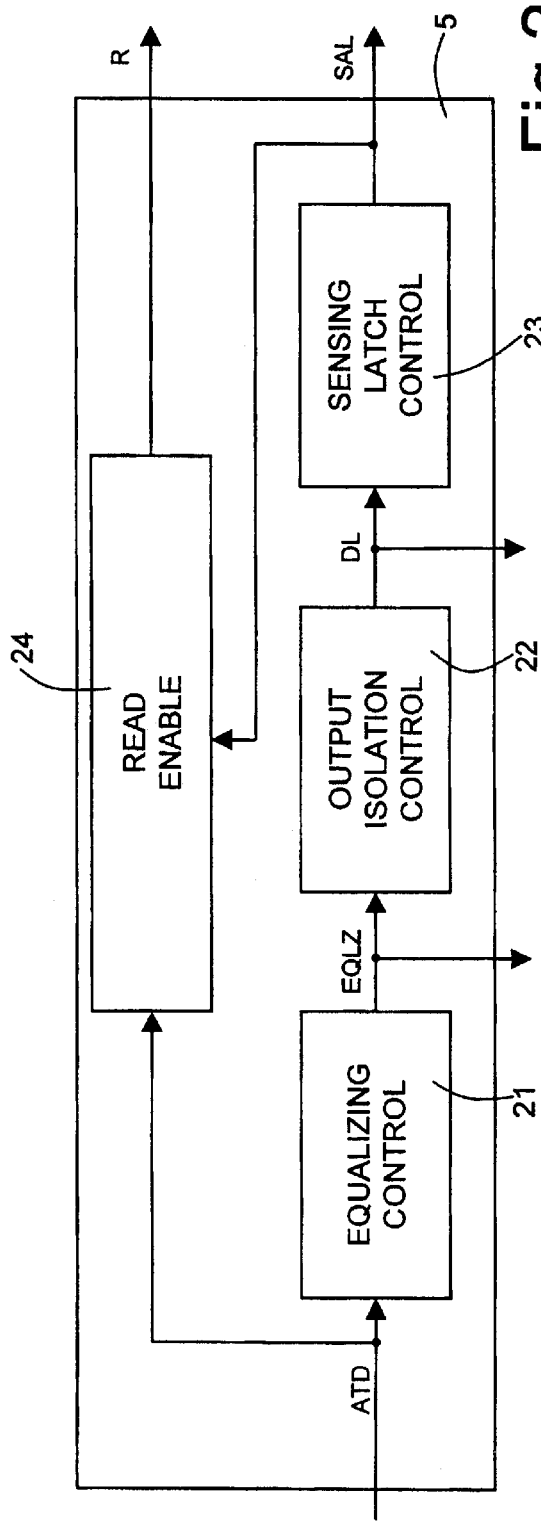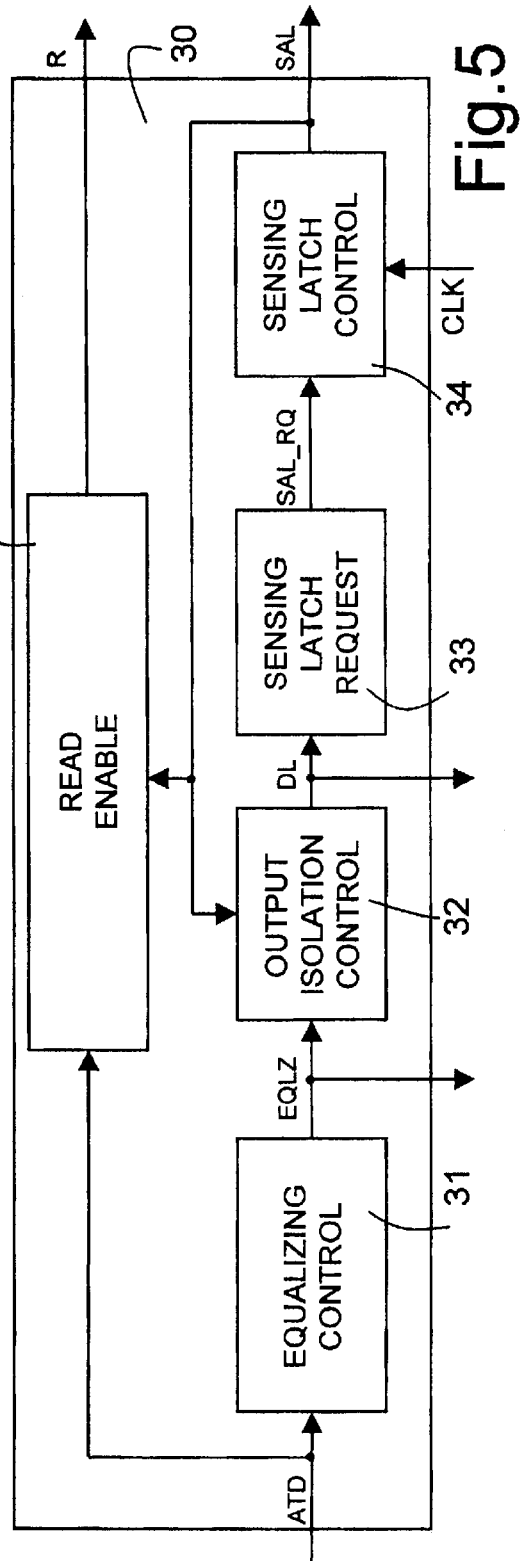
Fig.2 (Prior Art)
Fig.5

DEVICE AND METHOD FOR TIMING THE READING OF A NONVOLATILE MEMORY WITH REDUCED SWITCHING NOISE

BACKGROUND OF THE INVENTION

1. Field of the Invention

The present invention relates to a device and method for timing the reading a nonvolatile memory with reduced switching noise. In particular, the present invention is used in a flash memory adopting the FWH/LPC (Firm Ware Hub/Low Pin Count) protocol, without being limited thereto.

2. Description of the Related Art

As is known, in traditional flash memories that implement an asynchronous sensing solution, all timings are generated starting from delays which are preset and which can possibly be adjusted through appropriate configuration circuits. Configurability is particularly necessary in processes that are still to be completely characterized and for which, consequently, the variability of each process parameter is not known for certain.

For a better understanding of the problems overcome by the present invention, see FIG. 1, which shows a simplified block diagram of a memory device 1 formed by a flash memory using an FWH/LPC (Firm Ware Hub/Low Pin Count) protocol. The diagram of FIG. 1 thus comprises both the components proper to a flash memory and the components belonging to an FWH interface.

The memory device 1 of FIG. 1 comprises a memory array 2, a sensing stage 3, an output stage 4, a timing stage 5, a state machine 6, an output-enable generator 7, and an address-transition sensing stage 8.

In detail, the memory array 2 comprises, in a known way which is not illustrated, a plurality of memory cells, one or more reference cells, row-decoder and column-decoder stages for addressing the memory cells, and biasing, equalizing and conversion circuits for enabling reading, writing and erasing operations to be performed on the memory cells. The sensing stage 3 is connected to the outputs of the memory array 2 and comprises, in a known way, a plurality of sense amplifiers 15a, of which only one is shown, and a plurality of latch stages 15b, of which only one is shown. The output stage 4 is connected to the output of the sensing stage 3 through data switches 18 and comprises a plurality of output buffers 16 (of which only one is shown in the figure), which supply, on an output 9 of the memory, the data OUT read in the memory array 2. In the present example of a flash memory based on the FWH/LPC protocol, the output buffers 16 have characteristics such as to be able to work on a Peripheral Component Interconnect (PCI) bus.

The state machine 6, in a per se known manner, receives from outside an external clock signal CK and generates an internal clock signal CLK, which is supplied to the address-transition sensing stage 8. Furthermore, the state machine 6 generates a first state signal S(X) and a second state signal S(X+1). The first state signal S(X) controls an address switch 19 connected between an address input 10 of the memory device 1 which receives the address data ADDR and a node 11 connected both to the address-transition sensing stage 8 and to the memory array 2. The second state signal S(X+1) is supplied to the output-enable generator 7 so as to enable the latter to generate, at the appropriate instant, an output-enable signal OE, which is supplied to the output stage 4.

The address-transition sensing stage 8 receives from outside the address data ADDR and generates an address-transition signal ATD, which is supplied to the timing stage 5, which in turn generates, as will be described in greater detail hereinafter with reference to FIGS. 2 and 3, an equalizing signal EQLZ, a read signal R, a data-latching signal DL, and a sensing-latch signal SAL. In particular, and in a per se known manner, the equalizing signal EQLZ (active high) is supplied to memory array 2 to activate the array-equalizing step. The read signal R (active high) and the sensing-latch signal SAL (active low) are supplied to the sensing stage 3 so that the read signal R will activate the sense amplifiers 15a and then enable the sensing step, while the sensing-latch signal SAL will store, in the latches 15b, the data detected by the sense amplifiers 15a. Finally, the data-latching signal DL (active low) is supplied to the data switches 18 to prevent the data stored in the latches 15b from being sent to the output stage 4 during data modification.

The known timing stage 5 is implemented as shown in FIG. 2.

In detail, the timing stage 5 comprises an equalizing control circuit 21, receiving the address-transition signal ATD and outputting the equalizing signal EQLZ; an output-isolation control circuit 22, receiving the equalizing signal EQLZ and outputting the data-latching signal DL; a sensing-latch control circuit 23, receiving the data-latching signal DL and generating the sensing-latch signal SAL; and a read-enable circuit 24, receiving the address-transition signal ATD and the sensing-latch signal SAL and outputting the read signal R.

As shown in FIG. 3, after the first state signal S(X) has controlled closing of the address switch 19, when the address-transition sensing stage 8 detects switching of the input addresses, it generates a positive pulse of the address-transition signal ATD. Upon receiving this pulse, the read-enable circuit 24 causes the read signal R to switch to the high state, thus enabling reading by the sense amplifiers 15a. Furthermore, the equalizing control circuit 21 causes the equalizing signal EQLZ to switch to the high state, so activating the equalizing step for the memory array 2.

After a preset delay from switching to the high state by the equalizing signal EQLZ, the output-isolation control circuit 22 causes switching to the high state of the data-latching signal DL, thus bringing about opening of the data switches 18, and thus separating the sensing stage 3 from the output stage 4.

At the end of the equalizing step, the sense amplifiers 15a detect the datum supplied by the memory array 2.

After a preset delay from switching to the high state by the data-latching signal DL, the sensing-latch control circuit 23 generates a negative pulse of the sensing-latch signal SAL, which enables the latches 15b of the sensing stage 3 and causes switching to the low state of the read signal R, so terminating the reading step.

As soon as the data-latching signal DL switches back to the low state, the data switches 18 are closed again, so enabling transmission of the data to the buffers 16 of the output stage 4.

In the known memory device 1 described above, since all the timing signals shown in FIG. 3 are generated in an asynchronous way and are not correlated to other external events, it may happen that the sensing-latch pulse SAL is generated during switching to the low state of the output-enable signal OE, which is generated upon reception of the second state signal S(X+1). In this situation, data latching by the latches 15b takes place during activation of the output buffers 16. Or else, it may happen that the sensing-latch pulse SAL is generated at any other positive edge of the internal clock signal CLK subsequent to the switching referred to above of the output-enable signal OE, and thus at a time corresponding to switching of the output buffers 16. These conditions are illustrated in FIG. 3, in which the dashed line highlights the overlapping time window between the sensing-latch pulse SAL and the positive edge of the internal clock signal CLK. The foregoing is disadvantageous in so far as the switching noise of the output buffers 16 may disturb the supply lines, and thus modify the data read from the memory array 2. This is particularly troublesome in the case of output buffers operating on PCI buses, as in the case considered, since the buses require high currents and are thus three to four times noisier than the buffers present in other types of memories. Consequently, the noise induced on the supply lines may impair reading and render the memory altogether unreliable.

BRIEF SUMMARY OF THE INVENTION

An embodiment of the present invention provides a method and a circuit for timing the reading a nonvolatile memory that are free from the drawbacks described above.

Accordingly, an embodiment of the present invention provides a device for timing the reading a nonvolatile memory, comprising a data-sensing stage having an input receiving a sensing-latch signal and an output, and an output stage connected to the output of the data-sensing stage and enabled at a first switching edge of a sync signal, the read-timing device comprising a sensing control circuit generating the sensing-latch signal and characterized in that the sensing control circuit has a sync input receiving the sync signal and generating the sensing-enable signal not before a preset time interval has elapsed from the switching edge of the sync signal.

Moreover according to an embodiment of the invention there is a memory device that includes a memory array having an output; a data-sensing stage having a data input connected to the memory array, a sensing-enabling input, and an output; an output stage having an input connected to the output of the data-sensing stage and an enabling input receiving a sync signal, the output stage being enabled at a first switching edge of the sync signal; and a read-timing stage having an output connected to the sensing-enabling input of the data-sensing stage; wherein the read-timing stage has a sync input receiving the sync signal and generates the sensing-latch signal not before a preset time interval from the first switching edge of the sync signal.

Also, an embodiment of the invention includes a read timing method for reading a nonvolatile memory comprising a data-sensing stage and an output stage. The method comprises the steps of; supplying a sensing-latch signal to the data-sensing stage; supplying a sync signal to the output stage; enabling the output stage at a first switching edge of the sync signal; and generating the sensing-latch signal not before a preset time interval from the first switching edge of the sync signal. In practice, the reading step, in particular the data-latching step in the sensing stage is temporally separated from the switching step of the output buffers. This separation is obtained by exploiting the synchronization afforded by the system clock. Since the output buffers must switch in a preset time interval from the rising edge of the system clock, the latch pulse is shifted after this time interval, and more precisely after the falling edge of the system clock.

BRIEF DESCRIPTION OF THE SEVERAL VIEWS OF THE DRAWING(S)

For a better understanding of the present invention, a preferred embodiment thereof is now described, purely by way of non-limiting example and with reference to the attached drawings, in which:

FIG. 2 shows a block diagram of a known timing stage belonging to the memory device of FIG. 1;

FIG. 5 shows a block diagram of a timing stage according to the present invention;

DETAILED DESCRIPTION OF THE INVENTION

Figure 4:
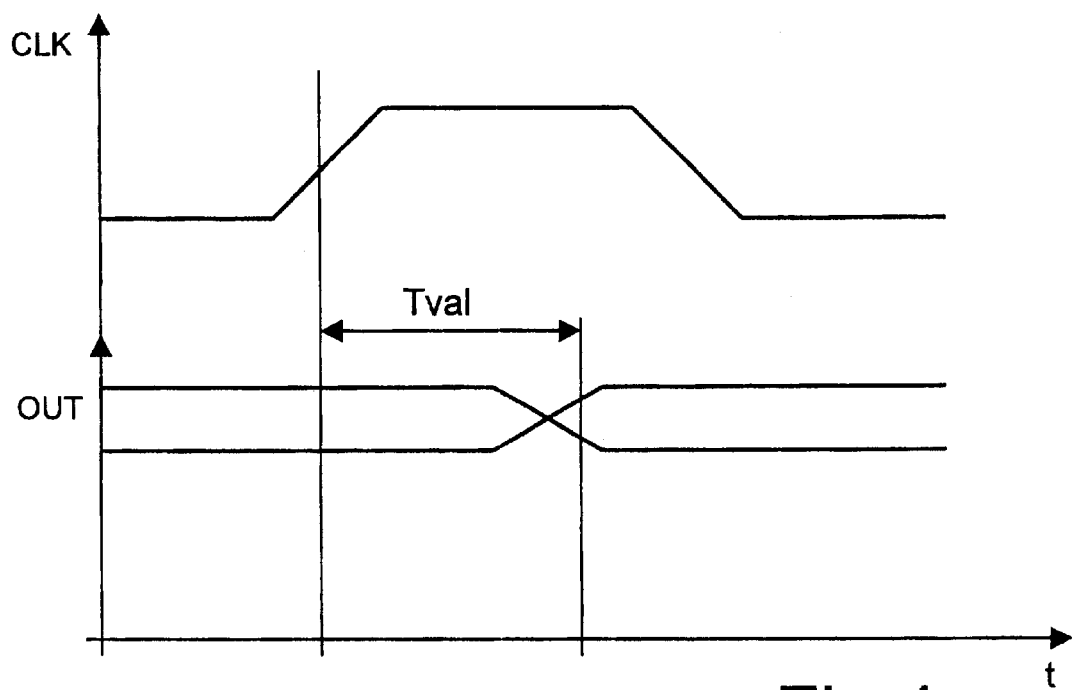
FIG. 4 shows the plot versus time of further known timing signals used in the memory device of FIG. 1.

An embodiment of the invention is based upon the consideration that latching of the data read by the sense amplifiers 15a in the latches 15b can be synchronized with the internal clock signal CLK, so as to take place in the half-period wherein neither the memory device 1 nor the external devices connected to the memory (for example, a controller) can cause switching of the output buffers 16. According to an embodiment of the invention, this half-period corresponds to the low state of the internal clock signal CLK, since the switchings of the output buffers 16, controlled by the output-enable signal OE, are activated on the rising edges of the internal clock signal CLK and end within a time Tval (FIG. 4), which thus represents the time elapsing between the positive edge of the internal clock signal CLK and when the output signal OUT reaches a value of $0.9*V_{CC}$ in case of switching to the logic state "1" and of $0.1V_{CC}$ in case of switching to the logic state "0", where $V_{CC}$ is the supply voltage of the memory device 1. This time interval typically ranges between a minimum of 2 ns and a maximum of 11 ns.

Figure 1:
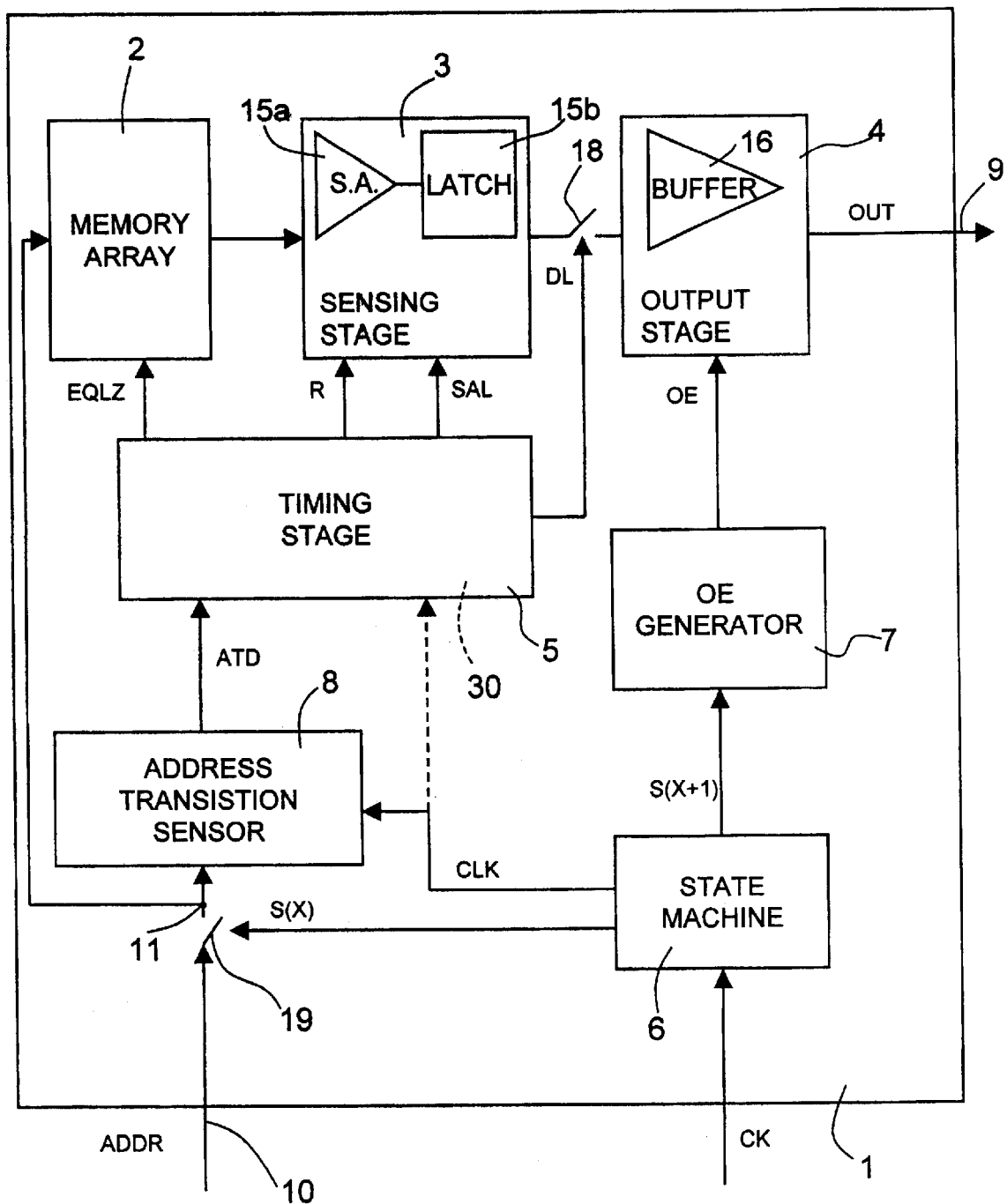
FIG. 1 illustrates a block diagram of a conventional flash memory.
Figure 3:
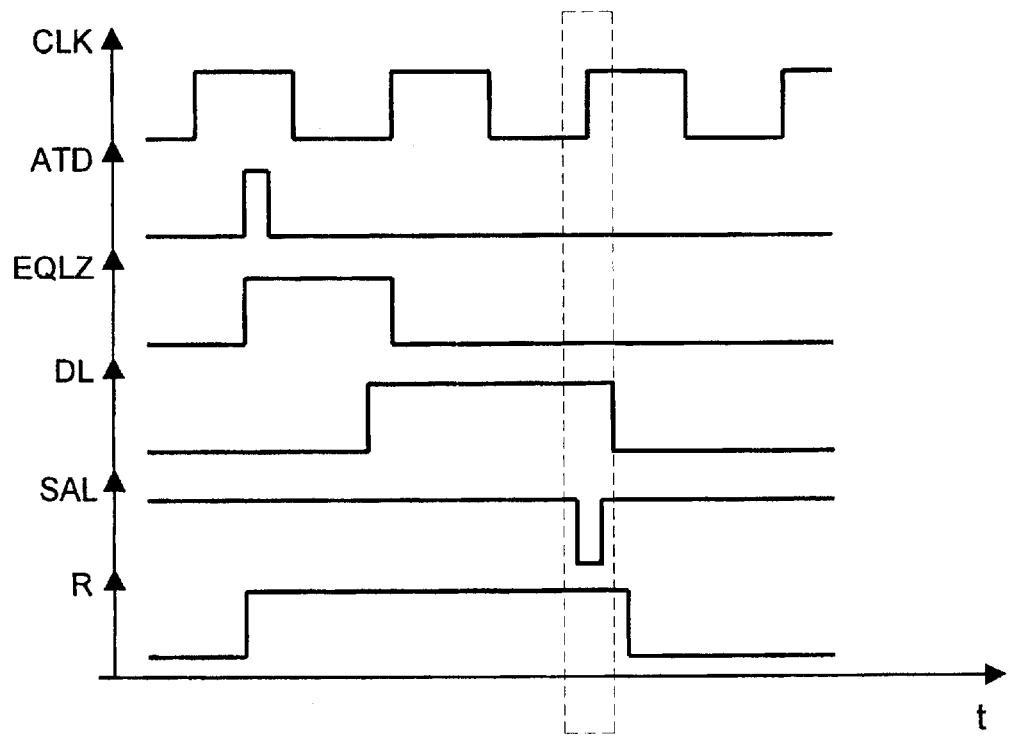
FIG. 3 illustrates the plot versus time of known timing signals supplied by the stage of FIG. 2.

To this end, according to an embodiment of the invention, a timing stage 30 is used in the memory device 1 of FIG. 1, instead of the timing stage 5, and to this end the timing stage 30 receives the internal clock signal CLK, as shown by the dashed line in FIG. 1.

A general block diagram of an embodiment of the timing stage 30 according to the invention, based upon the principle referred to above, is illustrated in FIG. 5 and is described hereinafter.

The timing stage 30 comprises an equalizing control circuit 31, identical to the equalizing control circuit 21 of FIG. 2; an output-isolation control circuit 32, which receives at the input the equalizing signal EQLZ and generates the data-latching signal DL; a sensing-latch request circuit 33, which receives the data-latching signal DL and generates a latch-request signal SAL_RQ; a sensing-latch control circuit 34, which receives the latch-request signal SAL_RQ and the internal clock signal CLK and generates the sensing-latch signal SAL; and a read-enable circuit 35, which receives the address-transition signal ATD and outputs the read signal R. In addition, the output-isolation circuit 32 and the read-enable circuit 35 also receive the sensing-latch signal SAL.

The timing stage 30 of FIG. 5 functions as follows. Upon receiving the positive pulse of the address-transition signal ATD, the read-enable circuit 35 causes the read signal R to switch to the high state, thus enabling the sense amplifiers 15a to reading (FIG. 1). Furthermore, the equalizing control circuit 31 causes the equalizing signal EQLZ to switch to the high state, thus activating the equalizing step of the memory array 2.

After elapsing a preset delay from switching to the high state of the equalizing signal EQLZ, the output-isolation control circuit 32 causes the data-latching signal DL to switch to the high state, so causing opening of the data switches 18, and thus separating the sensing stage 3 from the output stage 4.

At the end of the equalizing step, the sense amplifiers 15a detect the datum supplied by the memory array 2.

After a preset delay from switching of the data-latching signal DL to the high state, the sensing-latch-request circuit 33 causes the latch-request signal SAL_RQ to go to the high state, this signal being supplied to the sensing-latch control circuit 34. The latter, in the presence of the latch-request signal SAL_RQ, as soon as it detects a falling edge of the internal clock signal CLK, generates the negative pulse of the sensing-latch signal SAL which enables the latches 15b of the sensing stage 3 (FIG. 1). In addition, the sensing-latch signal SAL causes switching to the low state of the read signal R, thus ending the read step, and causes the data-latching signal DL to switch to the low state, so bringing about closing of the data switches 18 and transmission of the data to the buffers 16 of the output stage 4.

Figure 6:
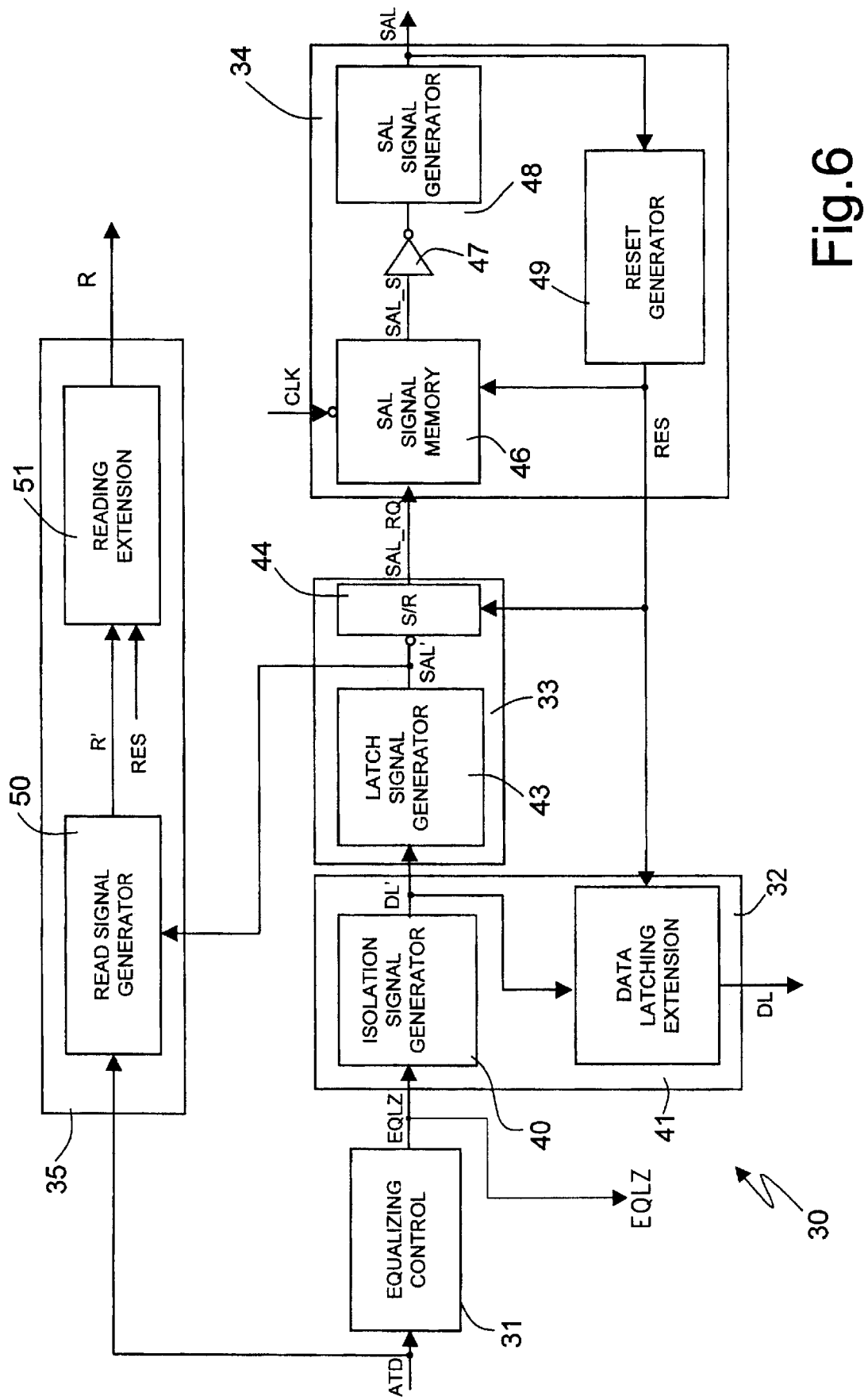
FIG. 6 shows a more detailed block diagram of some parts of the timing stage of FIG. 5.

FIG. 6 shows an embodiment of the timing stage 30.

Figure 7A:
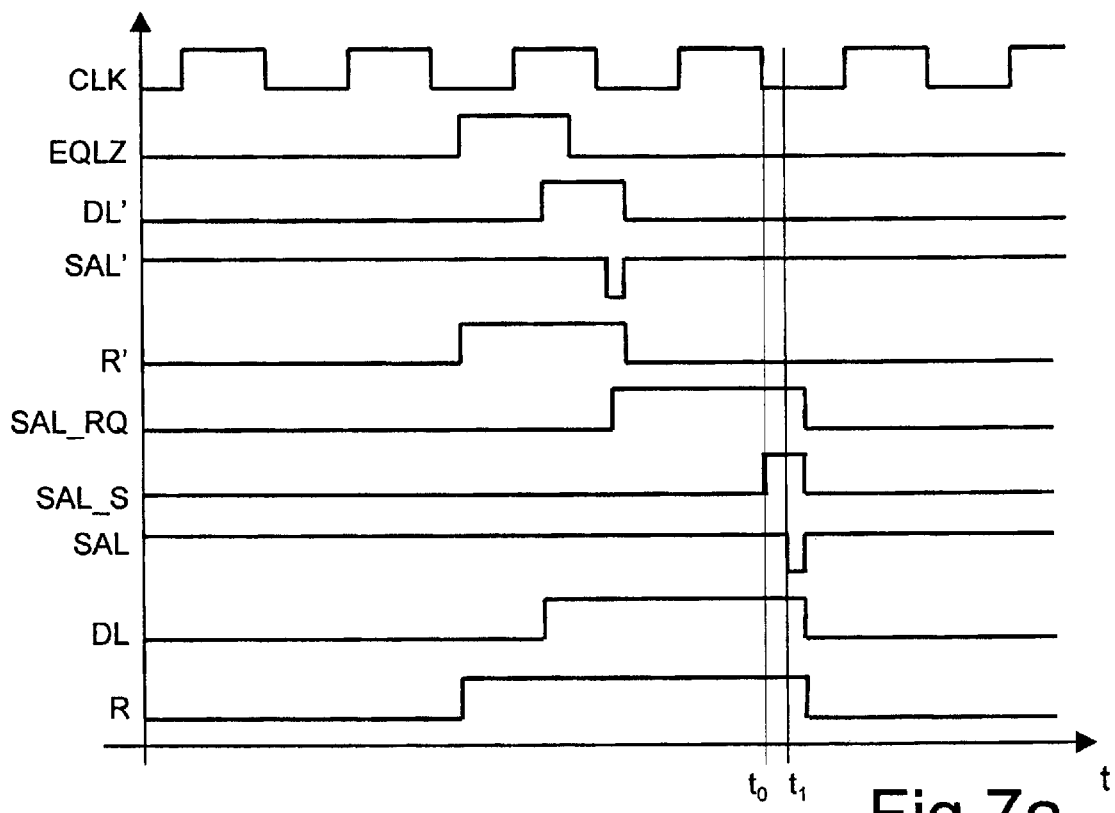
FIG. 7a shows the plot versus time of timing signals supplied by the circuit of FIG. 6 in a first operating condition.
Figure 7B:
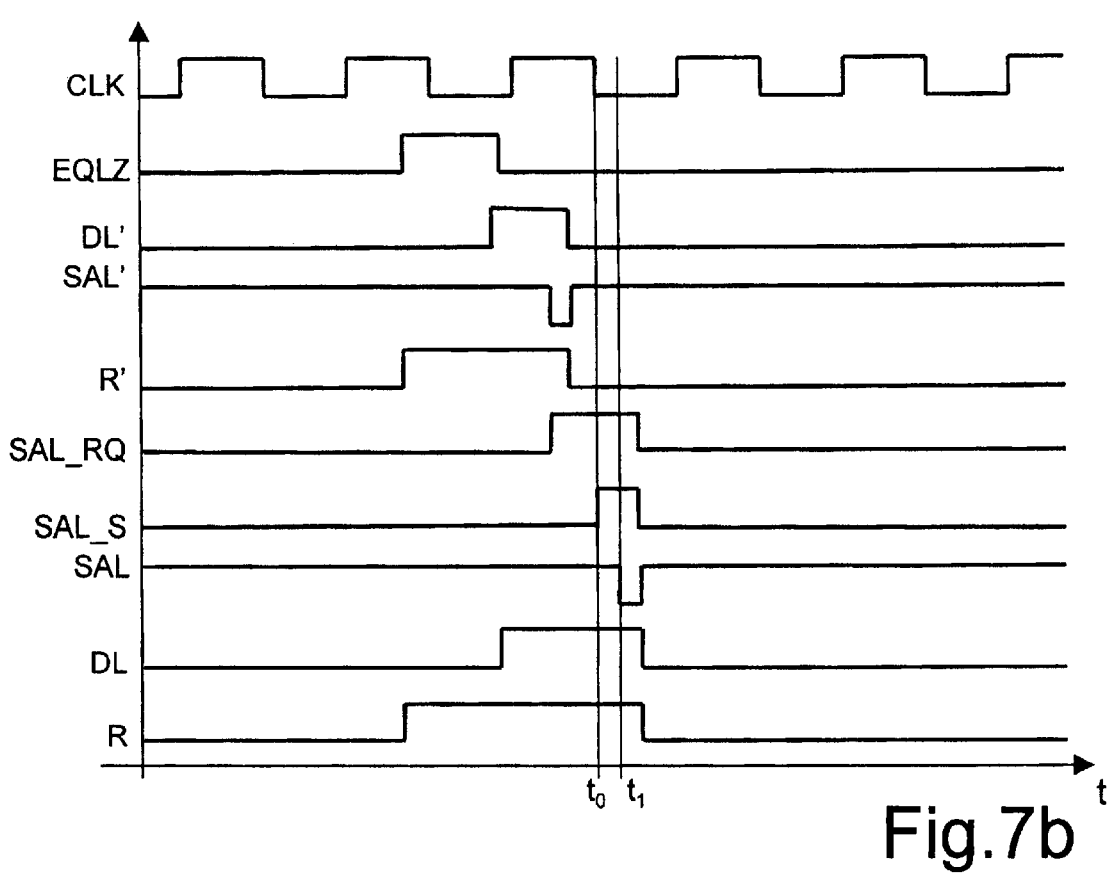
FIG. 7b shows the plot versus time of timing signals supplied by the circuit of FIG. 6 in a second operating condition.

In detail, the output-isolation control circuit 32 comprises an isolation-signal generator 40 which receives the equalizing signal EQLZ and generates an output-isolation activation signal DL'; and a data-latching extending circuit 41, which receives the output-isolation activation signal DL' and a reset signal RES, and generates the data-latching signal DL. The isolation-signal generator 40 is a logic circuit identical to the output-isolation control circuit 22 of FIG. 2; consequently, the output-isolation activation signal DL' corresponds to the data-latching signal DL of FIG. 2. The data-latching extending circuit 41 is a memory circuit (formed by a latch) which is set by the output-isolation activation signal DL' and is reset by the reset signal RES, so that the data-latching signal DL is prolonged with respect to the output-isolation activation signal DL', as shown in FIGS. 7a and 7b.

The sensing-latch-request circuit 33 comprises a latch-signal generator 43, receiving the output-isolation activation signal DL' and generating a sensing-latch activation signal SAL'; and a memory circuit 44, which receives the sensing-latch activation signal SAL', active low, and the reset signal RES, and generates the latch-request signal SAL_RQ. The latch-signal generator 43 is a logic circuit identical to the sensing-latch control circuit 23 of FIG. 2; consequently, the sensing-latch activation signal SAL' corresponds to the sensing-latch signal SAL of FIG. 2. The memory circuit 44, formed by a set/reset-type flip-flop, is set by the sensing-latch activation signal SAL' and reset by the reset signal RES, so that the latch-request signal SAL_RQ has a rising edge upon receiving the falling edge of the sensing-latch activation signal SAL' and a falling edge upon receiving the rising edge of the reset signal RES, as shown in FIGS. 7a and 7b.

The sensing-latch control circuit 34 comprises a latch-signal memory circuit 46, receiving the latch-request signal SAL_RQ, the internal clock signal CLK and the reset signal RES, and generating a synchronized latch signal SAL_S; an inverter 47, receiving the synchronized latch signal SAL_S; a sensing-latch signal generator 48, connected to the output of the inverter 47 and generating the sensing-latch signal SAL; and a reset generator 49, receiving the sensing-latch signal SAL and generating the reset signal RES. The latch-signal memory circuit 46, formed by a synchronized set/reset flip-flop, receives the latch-request signal SAL_RQ on its setting input, but can switch only upon receiving the falling edge of the internal clock signal CLK. The synchronized latch signal SAL_S can return to the low state only after receiving the reset pulse. Upon receiving a falling edge of the signal supplied by the inverter 47 and after a preset delay, the sensing-latch signal generator 48, which comprises a logic circuit, finally generates the negative pulse of the sensing-latch signal SAL, which is supplied to the latches 15b of FIG. 2. Upon receiving the positive rising edge of the sensing-latch signal SAL (end of negative pulse), the reset generator 49 in turn generates a reset pulse (reset signal RES), which causes switching to the low state of the data-latching signal DL, as indicated above, and reset of the memory circuit 44 and of the latching-signal memory circuit 46.

The read-enable circuit 35 comprises a read-signal generator 50, which receives the address-transition signal ATD and generates a read-activation signal R'; and a read-extending circuit 51, which receives the read-activation signal R' and generates the read signal R. The read-signal generator 50 is a logic circuit identical to the read-enable circuit 24 of FIG. 2; consequently, the read-activation signal R' corresponds to the read signal R of FIG. 2. The read-extending circuit 51 is a memory circuit (formed by a latch) which is set by the read-activation signal R' and reset by the reset signal RES, so that the read signal R is prolonged with respect to the read-activation signal R', as shown in FIGS. 7a and 7b.

FIGS. 7a and 7b show the plot versus time of the signals described with reference to FIG. 6, in the case of maximum delay between the sensing-latch activation signal SAL' and the sensing-latch signal SAL, and, respectively, in the case of a delay of less than one half of the period of the internal clock signal CLK.

Thereby, the sensing-latch signal SAL is synchronized with the internal clock signal CLK, namely, in the half-period wherein the internal clock signal CLK is low and the output buffers 16 cannot switch. Consequently, the effects caused by their switching are wholly avoided, even when the output buffers 16 operate on PCI buses and are consequently particularly noisy. Since the access time of a memory based upon an FWH/LPC protocol is independent of the duration of the sensing step and is imposed by the input/output protocol, lengthening of the reading time of the memory array does not impair the external behavior, but rather prevents reading failure thanks to the robustness to noise provided by such lengthening of the reading time.

In addition, the timing stage shown in FIG. 6 does not require a complete re-designing with respect to the known stage, in so far as it uses already present blocks (equalizing control circuit 31, isolation-signal generator 40, latch-signal generator 43, and read-signal generator 50), and simply adds logic circuits and/or memory circuits for the synchronizing the sensing-latch signal SAL and extending the data-latching signal DL and read signal R. Alternatively, the output-isolation control stage 32 and the read-enable stage can be implemented by simple logic circuits and/or memory circuits directly controlled by the equalizing signal EQLZ or, respectively, by the address-transition signal ATD and by the reset signal RES. The same applies to the sensing-latch-request circuit 33.

Finally, it is clear that modifications and variations may be made to the circuit and method described herein, without thereby departing from the scope of the present invention. For example, the invention can be applied also to memory devices of a type different from the one described, for instance to other types of nonvolatile memories, provided they have a synchronization clock.

What is claimed is:

1. A reading timing device for a nonvolatile memory that includes a data-sensing stage having an input receiving a sensing-latch signal and an output, and an output stage connected to said output of said data-sensing stage and said output stage enabled at a first switching edge of a sync signal, said read-timing device comprising a sensing-control circuit, generating said sensing-latch signal, wherein said sensing-control circuit has a sync input receiving said sync signal and generates said sensing-latch signal not before a preset time interval from said switching edge of said sync signal.

2. A reading timing device for a nonvolatile memory that includes a data-sensing stage having an input receiving a sensing-latch signal and an output, and an output stage connected to said output of said data-sensing stage and enabled at a first switching edge of a sync signal, said read-timing device comprising a sensing-control circuit, wherein said sensing-control circuit comprises synchronization means generating said sensing-latch signal upon receiving a second switching edge, opposite to said first switching edge, of said sync signal.

3. The reading timing device according to claim 2, that includes an equalizing-control circuit generating an equalizing signal having an activation edge upon detection of an address transition, and an output-data-latching circuit enabled by said activation edge of said equalizing signal and generating an output-data-latching signal having an own activation edge; said synchronization means comprising a sensing-latch-request circuit enabled by said activation edge of said output-data-latching signal and generating a latch-request signal; and a sensing-latch control circuit, receiving said latch-request signal and said sync signal and generating said sensing-latch signal upon receiving said second switching edge of said sync signal.

4. The reading timing device according to claim 3, wherein said sensing-latch control circuit comprises a latch-signal memory circuit and a pulse generating circuit, said latch-signal memory circuit receiving said latch-request signal and said sync signal and generating a synchronized latch-request signal upon receiving said second switching edge of said sync signal, and said pulse generating circuit generating said sensing-latch signal upon receiving said synchronized latch-request signal.

5. The reading timing device according to claim 4, further comprising a reset-generating circuit receiving said sensing-latch signal and generating a reset signal supplied to said latch-signal memory circuit.

6. The reading timing device according to claim 3, further comprising a reset-generating circuit receiving said sensing-latch signal and generating a reset signal supplied to said output-data-latching circuit, to said sensing-latch-request circuit, and to said sensing-latch control circuit.

7. The reading timing device according to claim 6, wherein said output-data-latching circuit comprises a first logic circuit generating an output-isolation-activation signal upon receiving said activation edge of said equalizing signal and a first latch circuit set by said output-isolation-activation signal and reset by said reset signal.

8. The reading timing device according to claim 6, wherein said sensing-latch-request circuit comprises a second logic circuit generating a sensing-latch activation signal and a second latch circuit set by said sensing-latch activation signal and reset by said reset signal.

9. The reading timing device according to any of claim 6, wherein said sensing-control circuit comprises a read-enable circuit generating a read signal switching to an enabling state upon detecting an address transition and switching to a disabling state upon receiving said reset signal.

10. A nonvolatile memory device, comprising:
a memory array having an output;
a data-sensing stage having a data input connected to said memory array, a sensing-enabling input, and an output;
an output stage having an input connected to said output of said data-sensing stage and an enabling input receiving a sync signal, said output stage being enabled at a first switching edge of said sync signal; and
a read-timing stage having an output connected to said sensing-enabling input of said data-sensing stage; wherein said read-timing stage has a sync input receiving said sync signal and generates said sensing-latch signal not before a preset time interval from said first switching edge of said sync signal.

11. The nonvolatile memory device according to claim 10, wherein said read-timing stage comprises synchronization means generating said sensing-latch signal upon receiving a second switching edge, opposed to said first switching edge, of said sync signal.

12. A method for reading a nonvolatile memory comprising a data-sensing stage and an output stage, the method comprising the steps of:
supplying a sensing-latch signal to said data-sensing stage;
supplying a sync signal to said output stage; and
enabling said output stage at a first switching edge of said sync signal,
generating said sensing-latch signal not before a preset time interval from said first switching edge of said sync signal.

13. The method according to claim 12, wherein said sensing-latch signal is generated upon receiving a second switching edge, opposed to said first switching edge, of said sync signal.

14. An output timing device comprising:
a reset generator having an output at which a reset signal is produced;
a sensing latch request circuit having an input receiving an activation signal, and an output producing a latch request signal in response to the activation signal;
a data-hold circuit having an input coupled to the output of the sensing latch request circuit, and output transmitting a sensing request signal for controlled activation of a sensing stage, and a reset input coupled to the output of the reset generator; and
an extension circuit having an input receiving the activation signal, an output transmitting a delayed signal for controlling activation of an output stage coupled to the sensing stage, and a reset input receiving the output of the reset generator, the delayed signal being a delayed version of the activation signal for controlling activation of the output stage.

15. The output timing device according to claim 14 wherein the data-hold circuit is a memory circuit.

16. The timing device according to claim 15 wherein the first memory circuit is a set/reset flip-flop.

17. The timing device according to claim 14 wherein the extension circuit is a memory circuit.

18. The timing device according to claim 17 wherein the memory circuit is a latch.

* * * * *